United States Patent [19]

Cohen

[11] Patent Number: 4,461,944

[45] Date of Patent: Jul. 24, 1984

[54] SYSTEM FOR INTERFACING AN ENCODER TO A MICROCOMPUTER

[75] Inventor: Robert K. Cohen, Troy, N.Y.

[73] Assignee: General Electric Company, Schenectady, N.Y.

[21] Appl. No.: 386,152

[22] Filed: Jun. 7, 1982

[51] Int. Cl.³ .............................................. B23K 11/24
[52] U.S. Cl. .................................... 219/110; 340/686; 364/561
[58] Field of Search ................ 219/109, 110; 340/686; 364/560, 561, 562

[56] References Cited

U.S. PATENT DOCUMENTS

| | | | |
|---|---|---|---|
| 4,161,781 | 7/1979 | Hildebrant et al. | 364/562 |
| 4,317,980 | 3/1982 | Goodrich et al. | 219/110 |
| 4,328,463 | 5/1982 | Avins | 328/133 |

OTHER PUBLICATIONS

Pertron Controls Corp., Instruction Manual for the Weldmaster PWC 300, pp. 1–10 only, Jul. 1977.
Hancock, Bi-directional Count from Quadrature Signals, Electronic Engineering, May 1978, p. 24.
Bruce A. Artwick, *Microcomputer Interfacing*, 1980, pp. 168–169.

*Primary Examiner*—C. C. Shaw
*Attorney, Agent, or Firm*—Donald R. Campbell; James C. Davis, Jr.; Paul R. Webb, II

[57] ABSTRACT

Data generated by an encoder with phase quadrature outputs, for instance a displacement transducer in a resistance spot welder control system, is read out of the interface to the computer in a format compatible with computer languages. The quadrature signals are converted to pulses representing positive and negative unit changes of displacement, and fed to an up-down counter which has signed two's complement values at its output. The most recent displacement data is read out while the counter continuously tracks the encoder.

8 Claims, 7 Drawing Figures

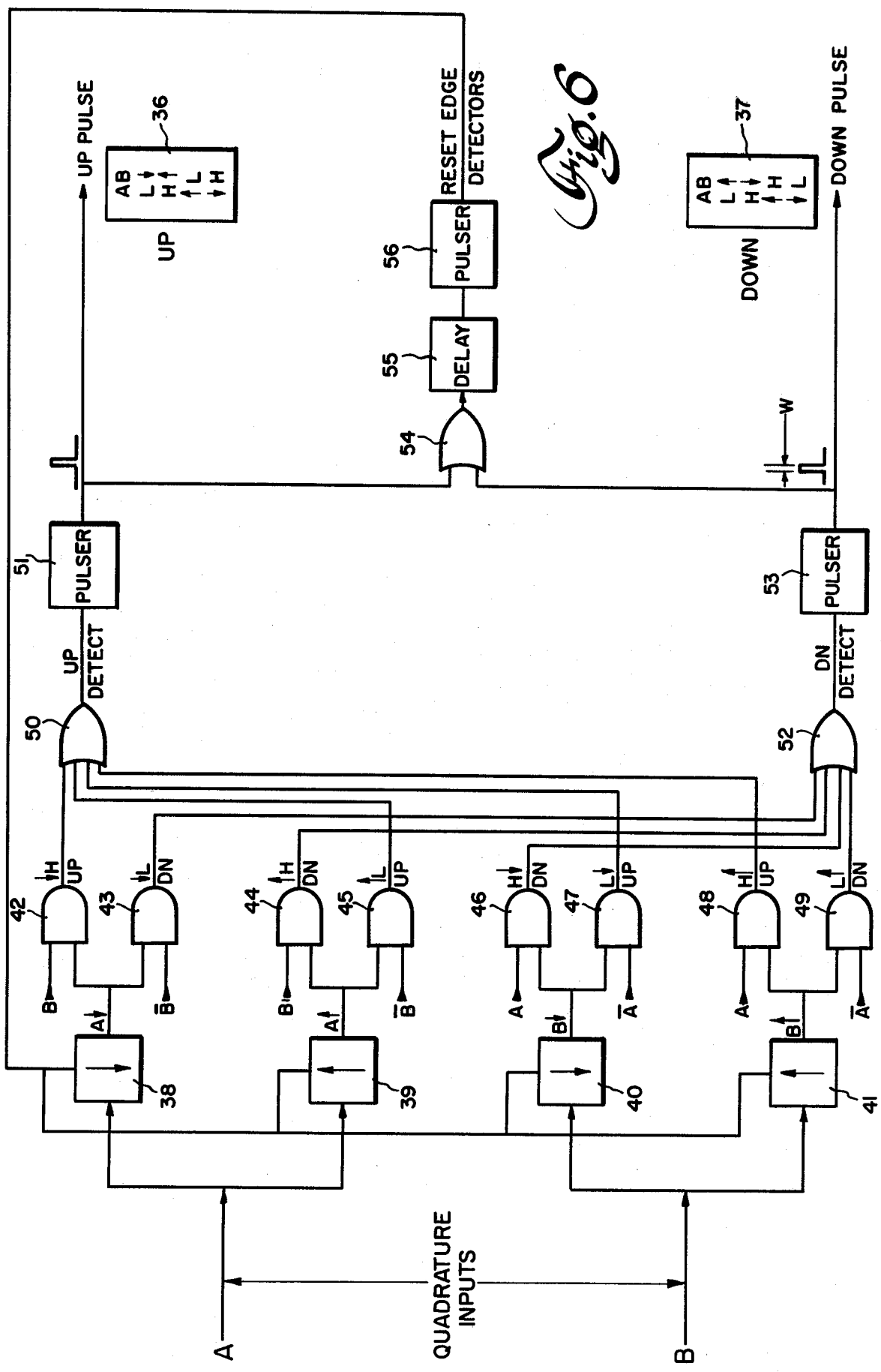

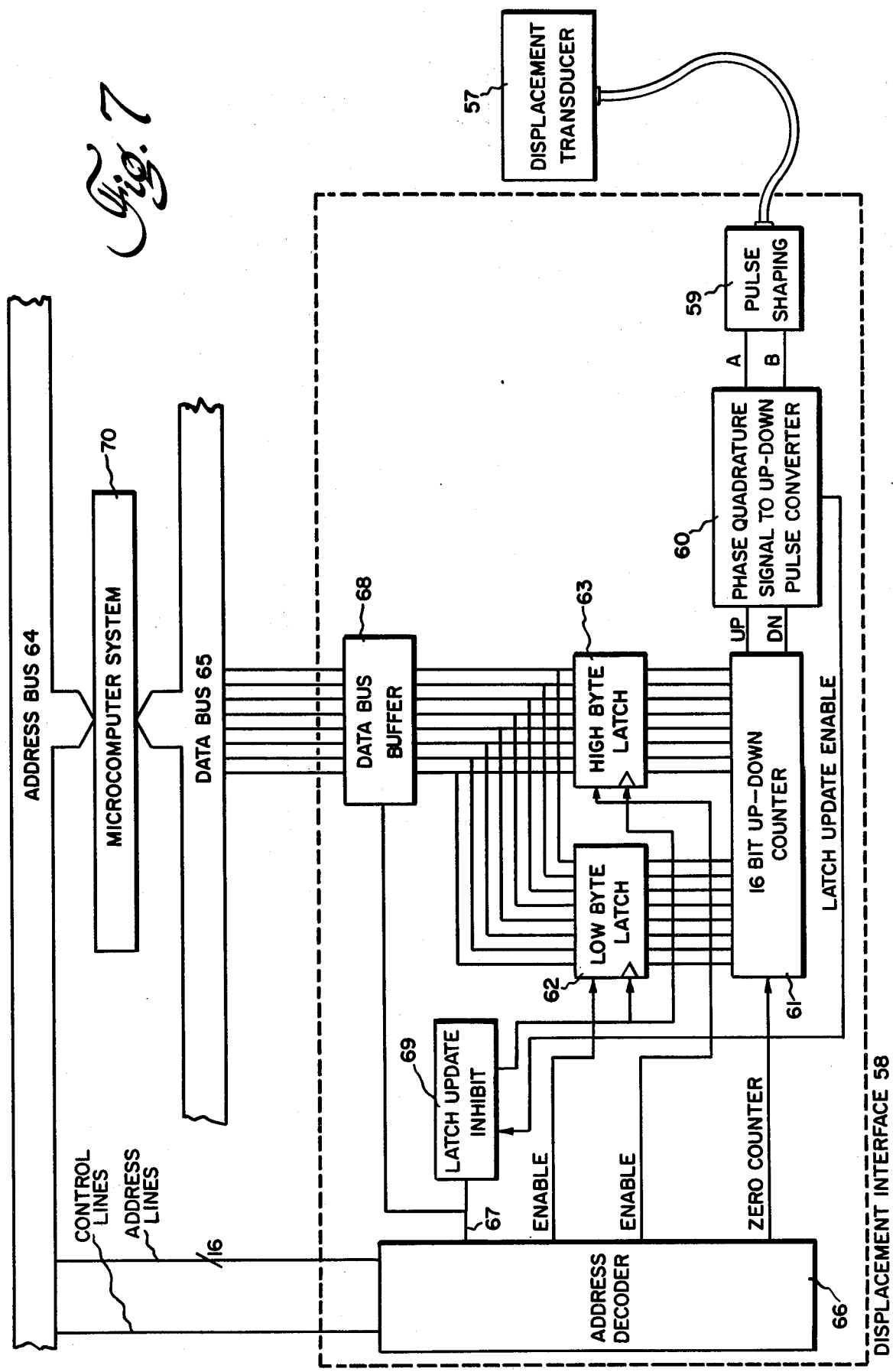

SYSTEM FOR INTERFACING AN ENCODER TO A MICROCOMPUTER

BACKGROUND OF THE INVENTION

This invention relates to an improved system for interfacing an encoder with phase quadrature outputs, such as a displacement sensor, to a microcomputer.

It is necessary to supply a computer with accurate displacement data which is used by a real time multivariable adaptive algorithm to control the formation of a resistance spot weld in process. A description of the microprocessor-based adaptive controller is given in the inventor's concurrently filed application Ser. No. 386,153, which is assigned to the same assignee. The overhead of the interface should be reduced to a theoretical minimum. Currently available peripheral interfaces that measure displacement information require significant processor overhead to acquire the data and to put it in a form which is recognized by the computer language. This decreases the amount of available computer time remaining for the implementation of an adaptive control algorithm, thereby reducing the complexity of the algorithm which can be programmed. A specific object of this invention is to provide a more efficient digital displacement interface which does not have to be managed by the processor.

The prior art method of interfacing the displacement device in the drawings to a computer in a format recognizable by most languages is as follows. The computer (1) asserts a data request signal through an output port; (2) waits for an asynchronous signal to signify that the displacement unit is finished processing the last displacement data point from the input transducer; (3) outputs a binary address corresponding to the decimal digit to be read; (4) reads the value of the digit through an input port; (5) repeats steps (3) and (4) for each decimal digit on the display; (6) reads the sign (+ or −) through an output port (7) performs a BCD (binary coded decimal) to binary conversion on the input data; and (8) stores the result in a set of memory locations assigned to the displacement variable by the computer language. This process is repeated each time the displacement value is updated. The procedure is very cumbersome, requiring much computer overhead.

SUMMARY OF THE INVENTION

The significant computer overhead associated with a peripheral interface to an encoder with phase quadrature outputs is eliminated by mapping the encoder data (displacement or some other physical parameter) directly into the computer in a format compatible with standard computer languages. Whenever the data is utilized in an algebraic relationship in the computer program, it is equal to the most recent reading of the encoder at the time the code is executed by the processor.

The system for interfacing an encoder with phase quadrature outputs to a computer has first means for converting the quadrature signals to series of pulses where each pulse represents a positive or negative unit change of a parameter such as displacement; second means, such as an up-down counter, to which said pulses are fed and that has at its output binary data which is a signed two's complement value indicative of the magnitude and direction of the parameter; and third means for reading out the binary data upon command to the computer, which is done while the second means continuously tracks the encoder and is fed pulses.

In a microcomputer-based spot welding control, an illustrative embodiment of the improved displacement interface detects state transitions of the encoder's binary signals and converts them to up and down pulses, each representing a unit displacement. The up-down counter has signed two's complement binary data at its output; this displacement data is strobed out into latches after each updating by the encoder. Address decode circuitry has an active state indicating that a read operation is to be performed from the interface. The latches are temporarily inhibited from being updated and enabled to transfer the latest displacement data to a data bus buffer and hence to the microcomputer bus.

BRIEF DESCRIPTION OF THE DRAWINGS

FIG. 6 is a flow diagram indicating the nature of the processing of quadrature signals to generate up and down pulses; and FIG. 7 is a simplified block diagram of the displacement interface and illustrates its relation to the transducer and microcomputer.

DESCRIPTION OF THE PREFERRED EMBODIMENTS

One purpose of this invention is to allow a computer language to define a variable representing displacement information which is automatically updated whenever a displacement gage, a digital optical encoder with phase quadrature outputs, changes its position by a given amount. All computer overhead associated with the updating process is eliminated. The displacement variable can easily be read by a computer program as would any other variable, except that this variable is always equal to the actual encoder displacement. The computer no longer has the burden of sampling the interface before utilizing the displacement variable in an algebraic relationship.

Figure 1:
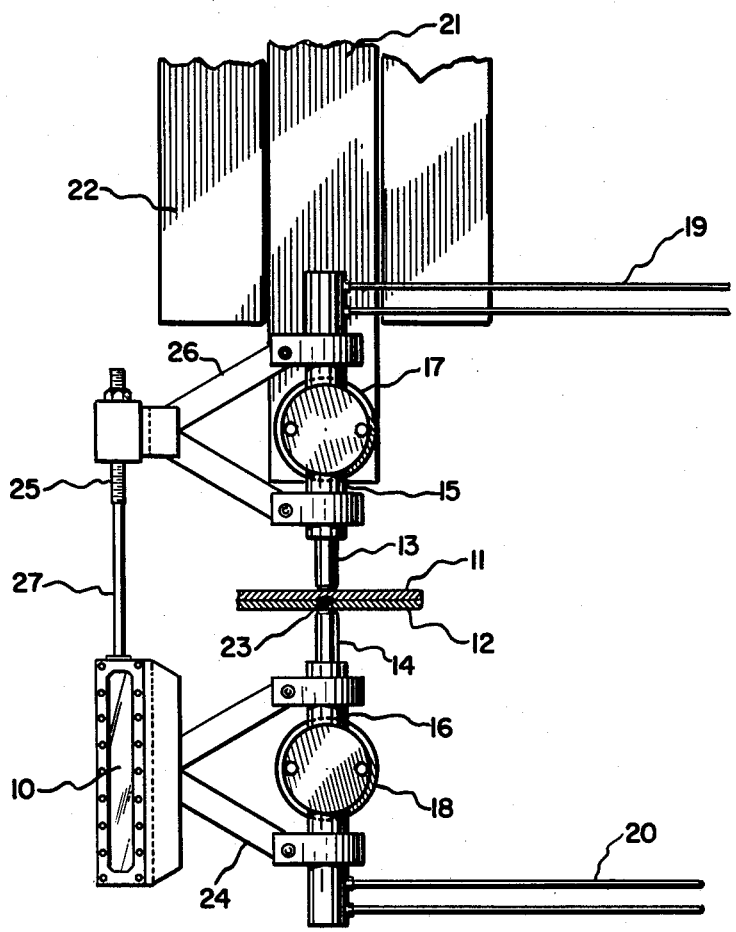
FIG. 1 is a partial front view of a resistance spot welding machine equipped with a displacement sensor.

Referring to FIG. 1, linear optical encoder 10 is used in a resistance spot welding adaptive control system to measure, during the diagnostic stage, the combined thickness of workpieces 11 and 12 and, during the welding and tempering stages, the thermal expansion of the workpieces. A conventional resistance spot welding machine is depicted in the figure, and the visible parts are low resistance copper electrodes 13 and 14, electrode holders 15 and 16, upper and lower conductor arms 17 and 18, and electrode water cooling lines 19 and 20. The ram slide 21, mounted in housing 22, is attached to conductor arm 17 and moves the upper electrode 13 relative to lower electrode 14; this permits the application of mechanical force to the electrodes before, during, and after the time the current flows in order to produce the proper conditions for heating and welding. The contacting surfaces in the region of current concentration are heated by pulses of low voltage, high amperage current to form the weld nugget 23. An experimental setup for sensing vertical electrode displacement uses the optical encoder 10 (for instance, Model SST-D49-Eb manufactured by Dynamics Research Corporation), which is mounted on an outrigger 24 off the lower electrode holder 16. It senses the relative motion of the upper electrode 33 through a rod 25 mounted on another outrigger 26 off the upper electrode holder 15 which moves with the upper electrode and bears on a plunger 27 in the top of the sensor. This installation of the displacement transducer cancels effects of machine flexing when the load is applied. Only the relative motion between the two electrodes is sensed and measured, that motion due solely to workpiece and electrode expansion, and the latter is negligble as long as the temperature change is small in the electrodes. This arrangement would likely be impractical in manufacturing because the throat of the machine is obstructed to workpieces that are large. In a factory machine the displacement sensor is located farther back in the welder.

Figure 2:
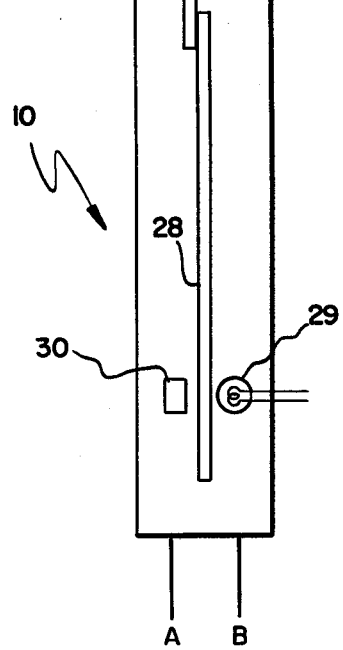
FIG. 2 is a sketch of a typical linear optical encoder.
Figure 3:
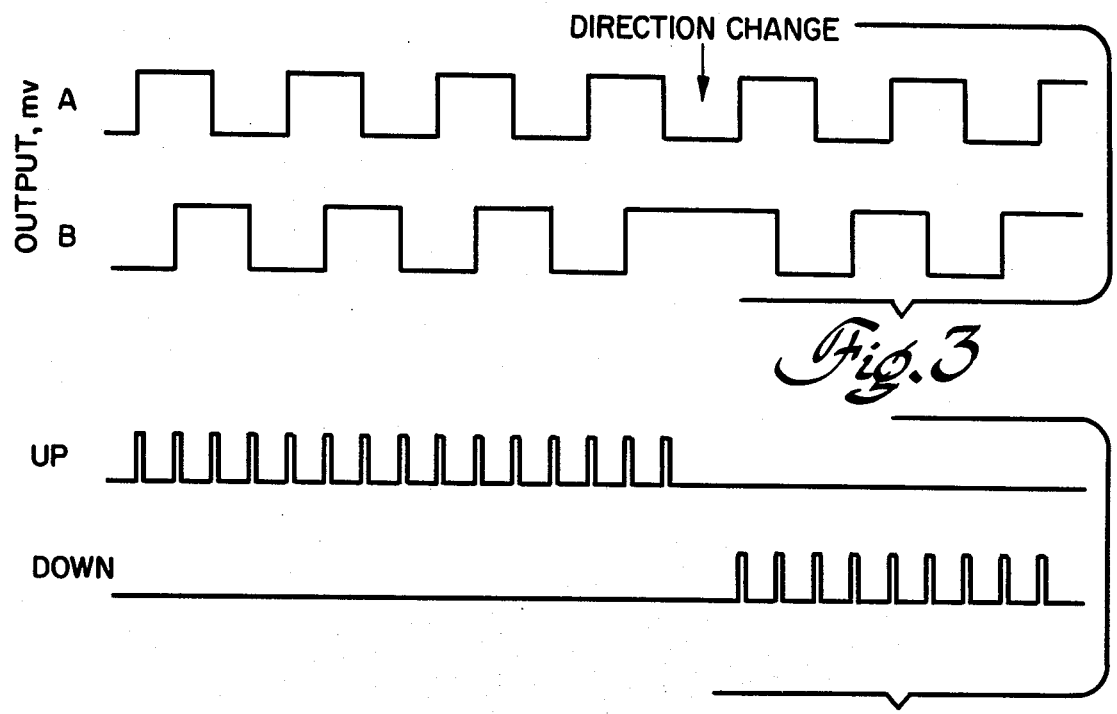
FIG. 3 is a waveform diagram of the phase quadrature outputs of the encoder before and after a change of direction.

Internal components of a typical linear optical encoder 10 are illustrated schematically in FIG. 2. A coded plate 28 is attached to and movable with the plunger 27 and has two parallel tracks of evenly spaced rectangular windows (the window length is equal to the distance between windows), one track offset from the other by one-half window length. The plate is illuminated by a light source 29 and two light sensors 30 sense the light which is alternately transmitted and blocked by the rows of windows. FIG. 3 shows the binary phase quadrature output signals on channels A and B assuming the gage moves out and in at a uniform velocity. In this case the pulse waves have a 50 percent duty cycle and either a 90° lagging or leading relation depending on the direction of movement. Relative edge to edge times are a function of instantaneous velocity.

Figure 4:
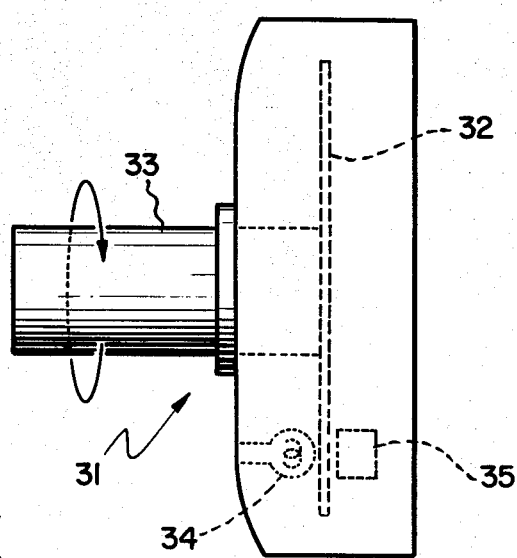
FIG. 4 depicts a rotary optical encoder.

The invention is also applicable to rotary optical encoders with phase quadrature outputs such as the device illustrated in FIG. 4. This incremental position encoder 31 has a coded disk 32 that rotates with the encoder shaft 33. The disk is illuminated by a light source 34 and has two circular tracks of evenly spaced, square windows which are offset from one another. Each track alternately passes light to a sensor 35 and blocks light. In a broader sense, any encoder with phase quadrature output signals which senses changes in a physical parameter other than displacement, such as voltage, may be interfaced to a computer system by the invention.

Figure 5:
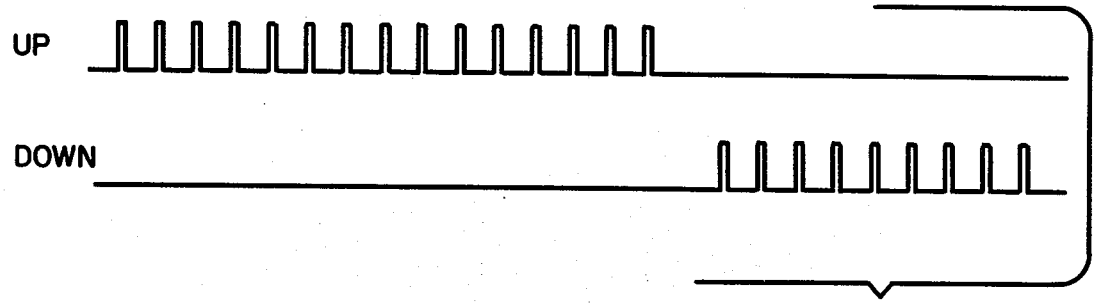
FIG. 5 shows up and down pulse trains derived from the signals in FIG. 3.

Referring to FIG. 5, the phase quadrature outputs are converted to a series of up pulses and a series of down pulses, each pulse representing a unit of displacement in respectively opposite directions. An up pulse or a down pulse is generated when the leading and trailing edges of either signal are detected. With regard to the DRC displacement transducer mentioned in the discussion of FIG. 1 which is used without the display box normally supplied with it, a pulse is transmitted on one output line each time the gage senses a 100 microinch change in displacement in the positive direction, and a pulse is transmitted on the other output line each time the gage senses a 100 microinch change in the negative direction. These series of pulses are fed to the up and down inputs of an up-down counter.

FIG. 6 is a flow diagram indicating the nature of processing quadrature inputs to get up and down pulse outputs and is not an optimum implementation of the converter circuitry. State transition tables 36 and 37 at the right of FIG. 6 give the eight combinations that result in the production of output pulses. The arrows designate rising and falling edges of the signals, more commonly known as leading and trailing edges; L and H stand for logic "zero" and "one". Quadrature signals A and B are fed to edge detectors 38–41; the first two detect the falling and rising edges of signal A and the second two detect the falling and rising edges of signal B. The outputs of the edge detectors are presented to AND logic circuits 42–49, the other inputs to which are the B and not-B signals and the A and not-A signals, as shown. The presence of a falling edge on signal A and a high B signal level results in an output from AND circuit 42 which passes through OR circuit 50 to pulser 51 where an up pulse is generated. If at this time there is a low B signal level, the output from AND circuit 43 is presented to OR circuit 52 and hence to pulser 53 and a down pulse is generated.

In the same way, the outputs of AND devices 45, 47, and 48 are connected to OR circuit 50, which detects any of the four state transition combinations in table 36 that result in an up pulse. The outputs of AND devices 44, 46, and 49 are connected to OR circuit 52 which detects the four state transition combinations in table 37 which result in down pulses. Both pulses, indicating a unit change in displacement in the positive or negative direction, are fed to OR device 54. A pulse of either type results in an output to delay circuit 55, and after a suitable delay the pulser 56 generates a reset pulse which is fed to all four edge detectors 38–41. The minimum time between pulses is the sum of W, the width of the output pulse, and $\tau$, the delay of circuit 55.

FIG. 7 has a simplified block diagram of the best mode of implementing the displacement interface in the real time adaptive control and quality assurance system for resistance spot welders which is disclosed and claimed in application Ser. No. 386,153. Displacement transducer 57 is a linear or rotary optical encoder with phase quadrature outputs; these dual channel signals are presented to interface 58. The pulse wave outputs are reshaped by pulse shaping cavity circuitry 59 and the A and B outputs are sent to phase quadrature signal to up-down pulse converter 60. A pulse is transmitted on the up line each time the gage senses a unit change in displacement in one direction (plunger 27 in FIG. 1 moves upward), and a pulse is transmitted on the down line each time the gage senses a unit change in the opposite direction (the plunger goes downward).

The first series of pulses are fed to the up input of 16-bit up-down counter 61, and the second series of pulses to the down input. The counter output provides a signed two's complement value which is directly proportional to the transducer position. This binary number system is well known to those skilled in the art and is described in texts on microprocessors. Some information is as follows. The left-most bit of the number indicates the sign, positive or negative. The sign of a two's complement number can be changed by changing the value of each bit (a "0" is changed to a "1" and vice versa) and adding +1. In a 16-bit system, the maximum negative unsigned magnitude is −32,768 and the maximum positive unsigned magnitude is +32,767. (Actually the counter goes from 0 to 65,535.) When the DRC linear displacement gage is used, each count represents 0.1 mil and the range is −3.2768 inches to +3.2767 inches. Thus, the workpieces may be easily inserted into the welding machine and removed.

Each time counter 61 is updated and either incremented or decremented, the binary data output is strobed into two octal latches 62 and 63 which contain the low byte and high byte, respectively. These are conventional 8-bit latches with a tristate output. Address bus 64 and data bus 65 are, for instance, part of the S-100 standard computer bus. Several control lines and sixteen adress lines connect bus 64 to address decoder circuitry 66 on the interface board. The decoder has a comparator whose output line 67 transitions to the active state when the proper bit pattern forms on the computer bus indicating a memory read operation is to be performed from displacement interface 58.

This enables a data bus buffer 68 to place data on bus 65. Another action which is simultaneously initiated is the triggering of a latch update inhibit 69 made up of, for instance, a one shot and an AND gate. Shortly after every up or down pulse, allowing time for the counter outputs to stabilize, converter 60 generates a latch update enable pulse which is sent to latch update inhibit 69 and normally passes through the AND circuit to latches 62 and 63. An output from the one shot prevents the latch update enable pulse from being gated by the AND circuit. Latches 62 and 63 are temporarily disenabled from being strobed for a short period such as 4 microseconds after the interface is accessed. The purpose of latch update inhibit 69 is to ensure that stable data will be read by the computer system 70 and to provide sufficient time for the computer to read both the lower and upper data bytes with the assurance that no transitions will take place in the interim. The board decoder 66 sequentially enables latches 62 and 63 which transfer the low order and high order displacement data bytes to buffer 68. The two data bytes are read out of displacement interface 58 into the microcomputer, to the place where it is instructed to put the data. It is not necessary to first transfer the data to microcomputer memory. Up-down counter 61 will track the displacement transducer 57 at all times and the computer 70 always obtains the most recent data at the time of the read operation.

Transducer 57 and displacement counter 61 are typically zeroed at the beginning of the day. Preferably electrodes 13 and 14 are brought together and this is zero displacement. Up-down counter 61 is zeroed in response to a zero counter instruction from board decoder 88. If the electrodes are changed or excessively deformed, it is necessary to change the zero.

One interface that was built had the following components: counter 61 had four cascaded type 74LS193 devices, latches 62 and 63 were type 74LS374 devices, and buffer 68 was a 74LS244 device.

The displacement data at the output of up-down counter 61 is a signed two's complement value and is in a format compatible with standard computer languages. This binary displacement data is read out of the interface upon command and appears to the microcomputer as part of its memory. Whenever the displacement variable is utilized in an algebraic relationship in the computer program, it will simply be equal to the present displacement on transducer 57 at the time the code is executed by the processor. An important feature is that the most recent displacement data is read out into the microcomputer bus without stopping counter 61, which continuously tracks the linear or rotary optical encoder. It will be understood that interface 58 may be used with other encoders that have phase quadrature outputs, and it is not limited to interfacing a displacement sensor to a computer.

While the invention has been particularly shown and described with reference to preferred embodiments thereof, it will be understood by those skilled in the art that the foregoing and other changes in form and details may be made therein without departing from the spirit and scope of the invention.

The invention claimed is:

1. In a resistance spot welder control system having a microcomputer, an encoder with phase quadrature outputs, and a displacement interface, the improvement wherein said interface appears to the microcomputer as part of its memory and comprises:
    means for converting the encoder quadrature output signals to up and down pulses which each represent a unit of displacement in respectively positive and negative directions;
    up-down counter means to which said pulses are fed and that has binary displacement data at its output;
    address decode circuitry having an active state output indicating a memory read operation is to be performed from said interface; and
    means for reading out said displacement data to the microcomputer.

2. The system of claim 1 wherein the encoder phase quadrature outputs are binary signals and said converting means is comprised of edge detectors, logic circuitry to determine whether an up or down pulse is to be produced when a signal edge is detected, and pulsers.

3. The system of claim 2 wherein said counter means provides signed two's complement displacement data at its output.

4. The system of claim 7 wherein said reading out means is comprised of low and high byte latches into which said displacement data is placed after each updating by the encoder, a data bus buffer, and means for temporarily inhibiting said latches from being updated and for sequentially enabling said low and high byte latches to transfer said displacement data to said data bus buffer and hence to the microcomputer.

5. A system for interfacing an encoder having phase quadrature output signals to a computer comprising:
    first means for converting the encoder quadrature output signals to two series of pulses which represent positive and negative unit changes of a physical parameter;
    second means to which said series of pulses are fed that has at its output binary data which is a signed two's complement value indicative of the magnitude and direction of said parameter; and
    third means for reading out said binary data to said computer upon command when a memory read operation is to be performed while said second means continuously tracks said encoder and is fed pulses.

6. A system for interfacing a linear or rotary optical encoder with phase quadrature outputs to a computer comprising:
    means for converting the encoder quadrature output signals to up and down pulses where each pulse represents a unit of displacement in respectively opposite directions;
    an up-down counter to which said pulses are fed and that has binary data which is a signed two's complement value indicative of displacement at its output; and
    means for reading out said displacement data into the computer upon command when a memory read operation is to be performed while said counter continuously tracks said encoder and is fed pulses.

7. The system of claim 6 wherein the encoder quadrature outputs are binary signals and said converting means generates an up or down pulse when leading and trailing edges of either signal are detected.

8. The system of claim 7 wherein said reading out means includes a latch into which said displacement data is strobed after each updating and means for temporarily inhibiting said latch from being updated while said displacement data is read out to a data bus buffer.

* * * * *

UNITED STATES PATENT AND TRADEMARK OFFICE
CERTIFICATE OF CORRECTION

PATENT NO. : 4,461,944
DATED : July 24, 1984
INVENTOR(S) : Robert K. Cohen

It is certified that error appears in the above—identified patent and that said Letters Patent is hereby corrected as shown below:

Column 6, claim 4, line 36, after the last word "microcomputer" insert the word --bus--.

Signed and Sealed this

Ninth Day of April 1985

[SEAL]

Attest:

DONALD J. QUIGG

Attesting Officer — Acting Commissioner of Patents and Trademarks